United States Patent [19]

Grosso et al.

[11] Patent Number: 5,100,928
[45] Date of Patent: Mar. 31, 1992

[54] COMPOSITIONS CONTAINING ORGANIC-SOLUBLE XANTHENE DYE PHOTOINITIATORS

[75] Inventors: Paul V. Grosso, West Hartford; Willard F. Burt, Bristol, both of Conn.; Guilford Jones, Canton, Mass.

[73] Assignee: Olin Corporation, Cheshire, Conn.

[21] Appl. No.: 510,766

[22] Filed: Apr. 18, 1990

[51] Int. Cl.⁵ .................. C08F 2/46; G03C 1/73; G03F 7/027; C08J 3/28
[52] U.S. Cl. .................. 522/25; 522/26; 430/281; 430/915; 430/916; 430/138
[58] Field of Search .............. 522/26, 14, 18, 16, 522/25

[56] References Cited

U.S. PATENT DOCUMENTS

| | | | |
|---|---|---|---|
| 4,251,619 | 2/1981 | Kurita | 522/26 |
| 4,551,407 | 11/1985 | Sanders et al. | 430/138 |
| 4,552,830 | 11/1985 | Reardon et al. | 522/14 |
| 4,554,235 | 11/1985 | Adair et al. | 430/138 |
| 4,632,899 | 12/1986 | Takeda | 430/281 |
| 4,751,102 | 6/1988 | Adair et al. | 522/26 |
| 4,766,055 | 8/1988 | Kawabata et al. | 430/920 |
| 4,801,392 | 1/1989 | Adair et al. | 522/26 |
| 4,869,981 | 9/1989 | Wing, Jr. et al. | 430/138 |
| 4,985,341 | 1/1991 | Rods et al. | 522/26 |

*Primary Examiner*—Marion E. McCamish
*Assistant Examiner*—Susan Berman
*Attorney, Agent, or Firm*—Dale Lynn Carlson

[57] ABSTRACT

Described herein are photopolymerizable compositions comprising at least one polymerizable ethylenically unsaturated compound, and an initiating combination of an organic soluble xanthene dye compound and an organic activator compound. These compositions are useful as radiation-curable coatings, photocurable films, and photoactive films.

8 Claims, No Drawings

COMPOSITIONS CONTAINING ORGANIC-SOLUBLE XANTHENE DYE PHOTOINITIATORS

This invention is directed to photopolymerizable compositions comprising (a) at least one polymerizable ethylenically unsaturated compound, (b) an initiating combination of an organic soluble xanthene dye compound and an organic activator compound. These compositions are useful as radiation-curable coatings, photocurable films, and photoactive films.

U.S. Pat. No. 2,875,047, issued Feb. 24, 1959, describes a process for the photopolymerization of vinyl monomers by irradiating with visible light in a liquid solution containing an organic photoreducible dye, a reducing agent, and a solvent for the vinyl monomer. The photoreducible dye may be an xanthene dye such as rose bengal and eosin. However, the xanthene dyes are soluble only in an aqueous media. Since these water-soluble, photo-reducible dyes are insoluble in organic media, it has heretofore been extremely difficult to perform visible light-initiated, dye-sensitized polymerizations in organic solution or in polymerizable compositions where the monomers involved are not soluble in aqueous media.

Smets et al. in Journal of Polymer Science. Vol. 55, pages 767–777, 1961, prepared block and graft polymers with pendant eosin dye groups by performing a ring-opening reaction on the eosin lactone with a polyamine and used the resulting organic-soluble polymer in an organic solution for dye-sensitized polymerization. However, such block and graft polymers with attached eosin molecules, either as side groups or as end groups, have reduced activity as a component of a photoinitiator system because of decreased mobility and accessibility of the dye moieties.

Lamberts, et al. in Tetrahedron, Vo. 41, No. 11, PP. 2183–2190, 1985, prepared organic soluble derivatives of a xanthene dye, i.e., rose bengal. These were used for singlet oxygen generation in nonaqueous solutions to effect preparative organic reactions and to elucidate photophysical pathways in such reactions. These organic-soluble derivatives of xanthene dyes were not used in dye-sensitized polymerizations in nonaqueous media.

In the present invention, it has been found that organic-soluble xanthene dyes used in combination with an organic activator compound are useful as photoinitiators for the photopolymerization of ethylenically unsaturated compounds. Such photopolymerizable compositions are useful as coatings and microcapsule core solutions. They are sensitive to visible light, particularly in the green-and-blue-light regions. The visible light sensitivity is provided in a nonaqueous medium.

The xanthene dyes herein are soluble in common organic solvents, and more importantly, in neat monomers of many types. In combination with a wide range of proton and electron donors also soluble in these media, a complete, organosoluble dye-sensitized polymerization (DSP) initiator composition is provided that exhibits a photospeed similar to that attainable in aqueous systems.

The composition of this invention comprises:

A. At least one addition polymerizable, ethylenically unsaturated compound having at least one terminal ethylene group and being capable of forming a high polymer by photoinitiated addition polymerization and;

B. an addition polymerization-initiating combination comprising:
  (1) an organic-soluble, radiation-sensitive xanthene dye that absorbs actinic radiation (for example, within the visible region of the spectrum) and is raised to an active state, and
  (2) a substantially water-insoluble organic activator compound that produces free radicals by interaction with said radiation-sensitive dye compound.

The composition may include one or more of the following: a leuco dye compound, an oxygen scavenger, an organic diluent, a chain transfer agent, or an antioxidant.

Suitable addition-polymerizable, ethylenically unsaturated compounds include: ethylenically unsaturated acid esters of polyhydric alcohols such as trimethylolpropane triacrylate or trimethacrylate, acrylate prepolymers derived from the partial reaction of pentaerythritol with acrylic or methacrylic acid or acrylic or methacrylic acid esters; isocyanate-modified acrylate and methacrylate and itaconic acid esters of polyhydric alcohols, and the like.

The parent xanthene dyes suitable for use herein are well-known in the art and are described in, for example, Kirk-Othmer, Encyclopedia of Chemical Technology, Chapter 24, titled Xanthene Dyes, pages 662 to 677, John Wiley & Sons, Inc., 1984. These xanthene dyes are made organophilic by the process described by Lamberts, et al. discussed supra. A Preferred xanthene dye is rose bengal (2,4,5,6-tetrachloro-2,4,5,7-tetraiodouranine) derivatized such that one or both sodium cations have been replaced by organic counterions that confer organosolubility to the salt. Suitable organic counterions include those derived from quaternary ammonium ions, e.g., tetrabutylammonium, tri-butylammonium, tetraoctylammonium, trioctylammonium, dioctylammonium, tribenzylammonium, and the like. Other xanthene dyes that may be employed include uranine (disodium fluorescine), eosin, and erythrosin. These dyes confer sensitivity to blue, blue-green, and green light, respectively. Monoesters of these dyes may also be used. For example, ethyl eosin either as the monoalkali metal salt or a tetraalkylammonium or -aralkylammonium salt will also function to initiate polymerization in the composition of this invention. The structures of several parent dyes suitable for use in the composition of this invention (disodium forms) are the following, reported with their lambda max:

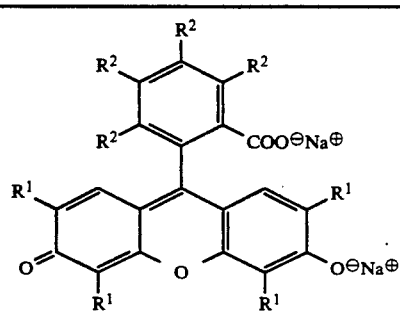

|  | $R^1$ | $R^2$ | $\lambda_{max}$ (nm) |
|---|---|---|---|
| uranine* | H | H | 491 |
| eosin | Br | H | 514 |
| erythrosin | I | H | 525 |

-continued

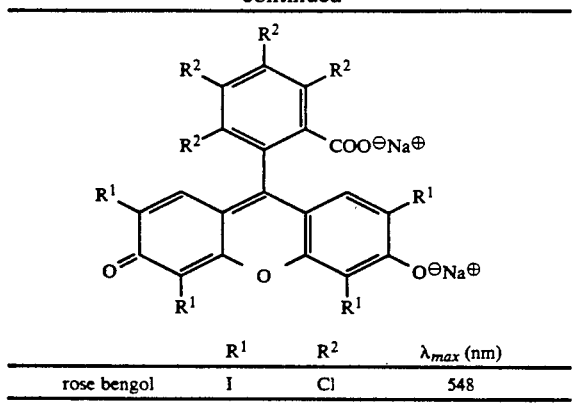

|            | R¹ | R² | $\lambda_{max}$ (nm) |
|------------|----|----|----------------------|
| rose bengol | I  | Cl | 548                  |

*Uranine is the disodium salt of fluorescein

Organic activator compounds, useful in the compositions of this invention, include N-aryl glycines, such as N-phenylglycine, N-methylindole-3-acetic acid, triethanolamine and other alkanolamines, and polymerizable activators such as aminoethyl acrylate and aminoethyl methacrylate. For the embodiment wherein an organosoluble but substantially water-insoluble activator is required, compounds such as N-alkylglycines, e.g., N-hexyl, -octyl, -decyl, etc., N-alkylindole-3-acetic acids, such as N-heptylindole-3-acetic acid (and similar N-hydrophobe materials), (methoxyphenoxy)acetic acids, p-dodecyl-benzenesulfinic acid salts and the like are preferred. Also useful are active methylene compounds such as dimedone, 1,3-dialkylbarbituric acids, and trichloromethyl substituted triazines.

The composition of this invention comprises (a) at least one addition-polymerizable, ethylenically unsaturated compound having at least one terminal ethylene group and being capable of forming a high polymer by photoinitiated addition polymerization; and (b) an addition polymerization-initiating combination of (1) an organic-soluble, radiation-sensitive xanthane dye compound that absorbs actinic radiation, e.g., in the visible region, and is raised to an active state, and (2) a substantially water-insoluble organic activator compound that produces free radicals by interaction with said active state of said radiation- sensitive dye. This composition is useful in high solids, radiation-curable coatings, and the like, where fast cure under visible light (which is less hazardous than UV radiation) is required. Additionally, this composition may include an oxygen scavenger such as any of a variety of aromatic and aliphatic amines or phosphines to reduce the need for an inert atmosphere during cure. The composition may also include an anti-oxidant such as di-t-butyl-hydroxytoluene (BHT), to prevent premature polymerization of the coating due to thermal initiation. A chain-transfer agent may also be added to aid the rapid increase in molecular weight required in coating applications. Suitable chain-transfer agents include mono- and polythiols such as dodecanethiol, thiobenzoxazole, and pentaerythritol tetramercaptoacetate. The composition of this invention, with one or more of the optional ingredients, is also useful in the preparation of volume phase holograms using an organic-soluble medium in contrast to an aqueous medium normally used.

The composition of this invention may be encapsulated and used in an imaging process such as that described in U.S. Pat. No. 4,869,981 which is incorporated herein in its entirety by reference.

The imaging process of said U.S. Pat. No. 4,869,981 comprises the steps of:

(a) forming a latent image on a photoreceptor substrate, in any of a variety of known manners, for example, by depositing a charge on a photoconductor and imagewise discharging or imagewise depositing a charge on a dielectric material, (b) electrostatically depositing a blended toner composition onto the latent image or onto a discharged surface of said substrate to form a toned image which is a positive or reverse image as compared to said latent image, the blended toner composition comprising at least two different toners, each of said toners comprising a different color precursor contained in photosensitive toner particles, (c) selectively photohardening or photosoftening at least a portion of said toner particles by imagewise exposure to appropriate wavelengths of radiation to provide harder toner particles and softer, rupturable toner particles, (d) transferring said harder toner particles and said rupturable toner particles to a copy surface, (e) rupturing at least a portion of said toner particles on said copy surface to release color precursor(s) from said rupturable toner particles, and (f) contacting said released color precursor(s) on said copy surface with a developer, thereby causing said released color precursor(s) and said color developer to react to form a color image on said copy surface.

A toner in the blended toner composition used in the above described imaging process may comprise: (a) at least one addition-polymerizable, ethylenically unsaturated compound having at least one terminal ethylene group and being capable of forming a high polymer by photoinitiated addition polymerization; and (b) an addition polymerization-initiating combination of (1) an organic-soluble, radiation-sensitive xanthene dye compound that absorbs actinic radiation, e.g., in the visible region, and is raised to an active state; and (2) a substantially water insoluble organic activator compound that produces free radicals by interaction with said active state of said radiation-sensitive dye.

Such a composition may also contain a leuco dye, i.e., a colorless compound that reacts with an acidic or complexing substance to form a colored dye. Suitable leuco dyes known in the art are preferably oil soluble color formers which will produce a color upon reaction with a developer material in the presence of a carrier oil. Substantially any of the precursors conventionally used in carbonless paper can be used in the composition of this invention. In general, these materials are colorless electron-donating type compounds. Representative color formers include substantially colorless compounds having in their partial skeleton a lactone, a lactam, a sultone, a spiropyran, an ester, or an amido structure. Specifically, these compounds include triarylmethane compounds, bisphenylmethane compounds, xanthene compounds, thiazine compounds, spiropyran compounds, and the like. Mixtures of the respective color precursors can be used, if desired.

Representative leuco dye color precursors which give yellow, cyan, and magenta images are the following:

Yellow color precursors:

-continued

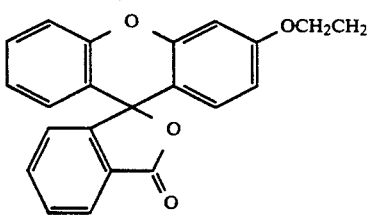

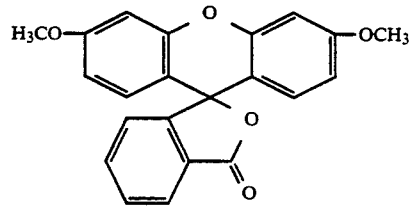

Cyan color precursors:

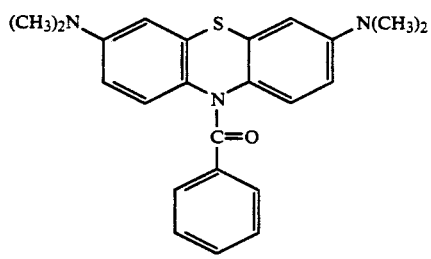

Cyan color precursors:

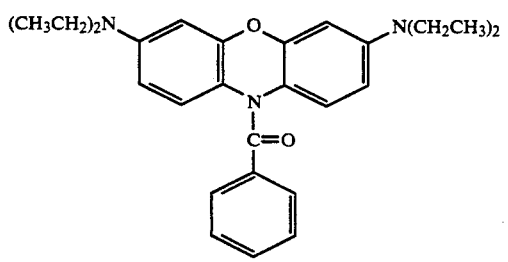

Cyan color precursors:

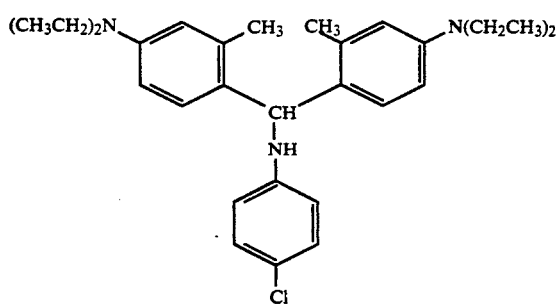

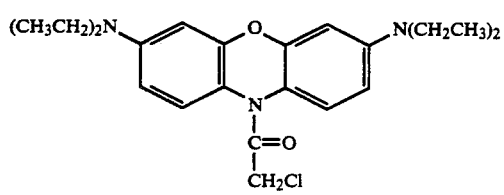

Magenta color precursors:

-continued

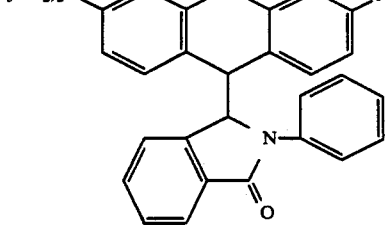

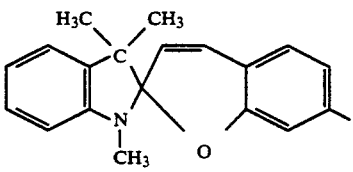

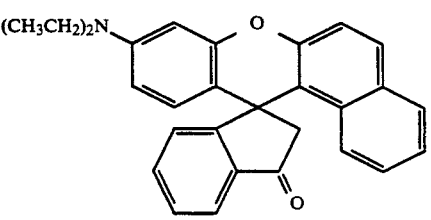

The color precursors used in the composition of this invention should be nonabsorbing with respect to exposure radiations used to cure the photosensitive encapsulate, since the color precursors are either present in the encapsulate or the exposure radiation must pass through the color precursor to expose the encapsulate. Hence, colorless electron-donating type compounds are preferred for use in the composition of this invention. Of course, a completely colorless color precursor is difficult to obtain and a small degree of coloration may be tolerated in the color precursor as long as it does not interfere with exposure.

The above components are encapsulated in a polymer or another kind of shell able to contain the components and rupturable by pressure or other means in order to release the capsule's contents on demand. This type of capsule can be used as a toner particle; electrostatic deposition and selective photohardening of the so-deposited toner particles, followed by, e.g., pressure rupture of the unhardened toner particles against a sheet of suitable paper provides regions of developed dye and no dye on the surface of the paper, resulting in an image.

The encapsulated composition may further contain an organic diluent to impart better spreading characteristics on the contents of the toner particle to ensure contact between the leuco dye and the developer compound. Suitable diluents include mobile monomers such as methyl methacrylate, vinyl acetate, butyl acrylate, styrene, and the like, and nonreactive solvents such as isoparaffins, high-boiling organic esters, and alkylaromatic compounds. Additionally, this composition may include an oxygen scavenger, such as any of the well-known aromatic and aliphatic amines or phosphines, to reduce the need for an inert atmosphere during cure. The encapsulated composition may also include an antioxidant, such as di-butyl-hydroxytoluene (BHT), to prevent premature polymerization of the coating due to thermal initiation. Also, a chain transfer agent may be present to aid the rapid increase in molecular weight required in this embodiment. Suitable chain-transfer agents include mono and polythiols such as dodecanethiol and pentaerythritol tetramercaptopropionate.

In the encapsulated composition, the utility of substantially water-insoluble, organosoluble, light-absorbing dyes and activators is apparent. Most commonly used encapsulation processes, and there are many known in the art, require dispersion of an oily, organic core phase in an aqueous emulsifier solution to form an oil-in-water emulsion. The wall-forming polymer or other compound is initially present in either the water or oil phase, and becomes insoluble as the encapsulation proceeds, locating at the interface between the two phases to form a film that effectively permanently stabilizes the emulsion. Where either a water-soluble, light-absorbing compound or activator is used, it would be extracted into the aqueous phase of the reaction during the vigorous agitation needed to form the emulsion and be lost from the organic, ethylenic monomer phase in the core. This condition would lead to photochemically inactive capsules or particles since one or both of the necessary photoinitiator components would be absent from the monomer phase. A similar situation exists in the case of encapsulation by spray-drying (spray-encapsulation), where the feed to the dryer is in the form of an oil-in-water emulsion. In this case, the particle wall is not formed by polymerization but by precipitation of a water-soluble wall material dissolved in the continuous phase as water is volatilized in the drying chamber.

The compositions of this invention are prepared by any of several methods. The photocurable film compositions are prepared by dissolving the sensitizer component of the photoinitiator system, such as rose bengal bis(dioctylammonium salt), in a liquid ethylenically unsaturated monomer in an amount from $10^{-6}$ to $10^{-2}$ M, to $10^{-5}$. The activators of the invention are employed at activator:dye mole ratios ranging from 1:1 to 2500:1, preferably 10:1 to 1000:1, and most preferably 200:1 to 500:1. Adjuvants such as oxygen scavengers, chain-transfer agents and color-formers are advantageously employed in amounts between 0 and 10 wt. %, preferably between 1 and 6%. For photohardenable-toner-particle applications, these photopolymerizable solutions are encapsulated in, for example, a melamine-formaldehyde shell (wall) by in situ polymerization or a starch wall by spray-encapsulation.

EXAMPLES

The following examples illustrate the process of this invention and are presented without the intention of being limited thereby.

EXAMPLE 1

Preparation of Rose Bengal Bis(dioctylammonium Salt)

Rose bengal lactone (1.0 g., 1 mmol) was suspended with stirring in 150 ml of methylene chloride. Dioctylamine (1.35 g., 5.6 mmol) was added by a disposable pipet, with simultaneous formation of a ruby-red solution. Evaporation of solvent gave a brick-red solid that was broken up with a spatula and triturated with ether to remove excess amine. The solid was collected on a Hirsch funnel and allowed to stand to allow ether to evaporate. Yield was 1.26 g., 85%. Elemental analysis: $C_{52}H_{74}O_5Cl_4I_4N_2$ requires C 42.88, H 5.12, Cl 9.73, I 34.85, N 1.92. Found: C 42.68, 42.58; H 5.05, 5.05; Cl 10.08, 9.83; I 34.5, 32.5; N 1.96, 1.91. FTIR: 2954, 2926, 2855, 1640, 1614, 1544, 1456, 1392, 1286, 954 cm. (Tetrahedron, 41 (11) 1985, p. 2189, compound 13, is the basis for this procedure).

EXAMPLE 2

Preparation of a Photocurable Film Composition Containing Rose Bengal Bis(dioctylammonium Salt)

In a 1-dram vial, 0.5 g. of a $7.35 \times 10^{-4}$ M solution of rose bengal bis(dioctylammonium salt) in tri-methylolpropane triacrylate (TMPTA)/methyl methacrylate (MMA) was prepared (TMPTA:MMA ratio was 4:1). To this was added sufficient -heptylindole-3-acetic acid to result in a concentration of 0.158 M. The vial was purged with argon for one minute, then capped and placed on its side (to provide a thin film) under a 100 W Blak-Ray lamp (UV products). Output of the lamp was filtered through a 530 nm long-pass filter (Oriel Model No. 51500); lamp-to-sample distance was six inches. After 120 seconds of irradiation, the sample was fully cured, hard, and hot to the touch.

EXAMPLE 3

Preparation of a Photocurable Film Composition Containing Rose Bengal Heptyl Ester In a one-dram vial, 0.5 g. of a $8.0 \times 10^{-5}$ M solution of rose bengal heptyl ester in hexanediol diacrylate was prepared. The ester was made by the method described in Tetrahedron, 41 (11) 1985, p. 2189, compound 17. To this was added 0.014 g. N,N,2,4,6-pentamethylaniline. The vial was Purged with argon for one minute, then capped and placed on its side (to provide a thin film of solution) under a 100 W Blak-Ray lamp. Output of the lamp was filtered through a 530 nm long-pass filter (Oriel Model No. 51500); lamp-to-sample distance was six inches. After 120 seconds of irradiation, the film was a fully cured, brittle solid, hot to the touch.

EXAMPLE 4

Preparation of a Photocurable Film Composition Containing Ethyl Eosin Tetraethyl Ammonium Salt and 2,4,6-Tris(trichloromethyl)-1,3,5-Triazine In a one-dram vial, a solution of 0.5 g. of hexanediol diacrylate containing 0.55 mg. ethyl eosin tetraethyl ammonium salt was prepared. The dye derivative was made by the method described in Tetrahedron 41 (11) 1985, p. 2189, compound 27. To this was added 0.021 g. 2,4,6-tris(trichloromethyl)-1,3,5-triazine. The vial was purged with argon for one minute, then capped and placed on its side (to provide a thin film of solution) under a 100 w Blak-Ray lamp. Output of the lamp was filtered through a 530 nm long-pass filter (Oriel Model No. 51500); lamp-to-sample distance was six inches. After 90 seconds of irradiation, the film was a fully cured, brittle solid, hot to the touch.

The experiment was repeated as above, except for the addition of 0.03 g. COPIKEM XX (Hilton-Davis) color-former. After 30 seconds of irradiation, the film was fully cured, had fractured from the heat generated by the cure, and was a dark magenta color.

EXAMPLE 5

Preparation of a Photocurable Film Composition Containing Methyl Eosin and 2,4,6-Bis(trichloromehtyl)-1,3,5-Triazine In a one-dram vial, a solution of 0.5 g. of hexanediol diacrylate containing 0.50 mg. methyl eosin (Aldrich) was prepared. To this was added 0.010 g. 2,4,6-tris(trichloromethyl)-1,3,5-triazine and 0.031 g. of COPIKEM XX color former. The vial was purged with argon for one minute, then capped and placed on its side (to provide a thin film of solution) under a 100 W Blak-Ray lamp. Output of the lamp was filtered through a green dichroic filter; lamp-to-sample distance was six inches. After 45 seconds of irradiation, the film was a fully cured, hard, magenta solid.

EXAMPLE 6

Preparation of a Photocurable Film Composition Containing Rose Bengal Bis(dioctylammonium Salt and Dimedone as Activator In a one-dram vial, 0.27 mg. of rose bengal bis(dioctylammonium salt) in hexanediol diacrylate was prepared. To this was added 0.012 g. of dimedone (Aldrich). The vial was purged with argon for one minute, then capped and placed on its side (to provide a thin film of solution) under a 100 W Blak-Ray lamp. Output of the lamp was filtered through a 530 nm long-pass filter (Oriel Model No. 51500); lamp-to-sample distance was six inches. After 120 seconds of irradiation, the film was a fully cured, brittle solid, hot to the touch.

EXAMPLES 7 TO 12

Preparation of Photocurable Film Compositions Containing Rose Bengal Bis(dioctylammonium Salt)

A series of photocurable film compositions similar to those in Example 2 (except that the solvent was hexanediol diacrylate [HDDA]) were prepared and tested for photoactivity and the effect of dye-to-activator ratio. The results are set forth in Table 1:

TABLE 1

| Example | Initial Conc. × $10^{-(a)}$ | Activator Conc. × $10^{-(a)}$ | Ratio Act/Init | Comments |
| --- | --- | --- | --- | --- |
| 5 | 2.70 (4) | 1.48 (1) | 548:1 | Warm, colorless semi-brittle solid |
| 6 | 2.70 (4) | 6.90 (2) | 255:1 | Warm, almost colorless semi-brittle solid |
| 7 | 2.70 (4) | 3.68 (2) | 136:1 | As above |
| 8 | 2.70 (5) | 1.43 (1) | 5296:1 | Near colorless or colorless before exposure |
| 9 | 2.70 (5) | 7.53 (2) | 2789:1 | Soft cure, sl. colorless before exposure |
| 10 | 2.70 (5) | 3.67 (2) | 1359:1 | Soft cure, colored before exposure |
| 11 | 7.49 (4) | 1.57 (1) | 210:1 | Cured thru hot, sl colored, hard solid |

EXAMPLE 13

Spray-encapsulation of Photohardenable Toner Particles Containing Rose Bengal Bis(dioctylammonium Salt)

Magenta color-forming toner particles, which were sensitive to green light, were prepared by spray encapsulation from an oil-in-water emulsion as follows:

A solution was prepared by stirring 100 g. of water and 100 g. of CAPSUL ® modified starch (a product of National Starch and Chemical). The pH was adjusted to 4.0 with 10% sulfuric acid, and the solution was cooled to room temperature. The toner core solution was prepared by first mixing 20 g. of trimethylolpropane triacrylate with 5.5 g. of methyl methacrylate. To this was added 1.5 g. of COPIKEM ® XX (a product of Hilton-Davis), a magenta dye precursor, which was dissolved by heating to 75° C. with stirring. After the color former had dissolved, the mixture was cooled to room temperature. Next, 0.001 g. of rose bengal bis(dioctylammonium salt) and 0.15 g. of N-heptylindole-3-acetic acid were added under yellow illumination and stirred until dissolved. The core solution was added in its entirety to the aqueous phase and agitated in a Waring Blendor for one minute to form an emulsion. This emulsion was fed, at a rate of 5 ml/minute, to a Buchi Mini Spray Dryer at a drying chamber temperature of 170° C. and an outlet temperature of 110° C. Ten grams of a white, free-flowing powder of encapsulated toner particles were collected in the sample collector of the spray dryer. When the dry particles were washed with either ISOPAR ® G or methylene chloride, no core material was extracted, indicating intact particles.

The particles, when crushed by pen pressure or in a nip roll mechanism against NCR coated paper (20 lbs., a product of Appleton Papers), produced a magenta color. A thin coating of the particles was deposited on NCR paper by dispersing the former in a few ml of ISOPAR G and spreading on the paper. One region of the spread-out particles was masked, and the entire sheet was exposed to visible light longer than 530 nm as in Example 2. When the sheet of NCR paper was run through a nip roll mechanism, the light-exposed regions, where the particles were hardened, did not give rise to color whereas the unexposed regions produced a magenta color on the NCR paper.

EXAMPLE 14

Spray-encapsulation of Photohardenable Toner Particles Containing Rose Bengal Bis(dioctylammonium Salt) and 1,3-Dibutylbarbituric Acid as Activator Magenta color-forming toner particles, which were sensitive to green light, were prepared by spray encapsulation from an oil-in-water emulsion as follows:

A solution was prepared by stirring 150 g. of water and 33 g. of CAPSUL modified starch (a product of National Starch and Chemical). The toner core solution was prepared in 10 g. of hexanediol diacrylate. To this was added 0.60 g. of COPIKEM ® XX (a product of Hilton-Davis), a magenta dye precursor, which was dissolved by heating to 75° C. with stirring. After the color-former had dissolved, the mixture was cooled to room temperature. Next, 0.0056 g. of rose bengal bis(dioctylammonium salt) and 0.90 g. of 1,3-dibutyl-barbituric acid and 0.51 g. of N,N,2,4,6-pentamethylaniline were added under yellow illumination and stirred until dissolved. The core solution was added in its entirety to the aqueous phase and agitated in a Waring Blendor for one minute to form an emulsion. This emulsion was fed, at a rate of 5 ml/minute, to a Buchi 190 Mini Spray Dryer at a drying chamber temperature of 183° C. and an outlet temperature of 112° C. White, free-flowing powder of encapsulated toner particles were collected in the sample collector of the spray dryer. When o the dry particles were washed with either ISOPAR ® G or methylene chloride, no core material was extracted, indicating intact particles.

A single-color toner was prepared by the method of Example 11. Using corona-charging and Versatec ® dielectric Paper, a 2"×0.5" latent image was formed on the paper using a plastic template (the template had a 2"×0.5" hole cut in it). The paper bearing the latent image was dipped in the toner bath, and excess ISOPAR dried. After masking the toned image, exposure to a 100 W Blak-Ray lamp (6" lamp-to-sample distance; 530 nm long-pass filter; 5 minute exposure time) caused the cores of the toner particles to harden; areas of the toned image covered, and thus unexposed, had unhardened toner particles. This was demonstrated by passing the irradiated, toned image (in contact with 20 lb. NCR paper) through a nip-roll mechanism. The exposed, hardened areas gave no color and the unexposed, unhardened areas gave a magenta color on pressure development.

EXAMPLE 15

Incorporation of Photohardenable Toner Particles Containing Rose Bengal Bis(dioctylammonium Slat) Into a Three-color Blended Liquid Toner A three-color, liquid, blended toner was prepared by combining 7.4 g. of dry, blue color-forming toner powder (hardenable by near-UV light), 7.4 g. of dry, yellow color-forming toner powder (hardenable by blue light), and 14.8 g. of dry, magenta color-forming toner powder (as prepared in Example 12, hardenable by green light) with 2,220 g. of ISOPAR G. The former two kinds of toner particles were prepared according to the procedure set forth in Example 1 (A) (1) of U.S. Pat. No. 4,869,981, incorporated herein by reference. POLYMER III PART C (46.6 g, a product of Olin Hunt) was added as a dispersing aid and charging agent. The toner was placed in an ultrasonic bath in order to disperse the toner particles. The toner was then transferred to a plastic jug for storage.

The above three-color blended toner was added to the toner tray of a Savin 895 LTT photocopier. The paper tray of the copier was loaded with 20 lb. NCR paper. The target used to image the three-color toner was a rectangular block of twelve 0.5"×0.5" black squares, arranged in three columns of four blocks each. After depressing the "print" button on the Savin 895, output from the copier was received in the form of a colorless, toned image consisting of a mixture of all three constituent toner particle types deposited imagewise, to duplicate the target image, on the NCR paper. This target was chosen for convenience, but in principle any such image may be reproduced by this electrostatic method.

Excess ISOPAR G was allowed to evaporate, then individual squares were selectively photohardened in a manner similar to that described in U.S. Pat. No. 4,869,981 Example 1 (B), incorporated herein by reference. The intensity of the filtered light was varied by exposing the selected squares of the toned image at a distance of either 6 inches or 2 inches from the 100 W lamp. This was made necessary by the depth of the toner layer deposited by the Savin 895 LTT photocopier.

The selectively photohardened, toned image on NCR paper was then passed through a set of nip rolls in order to rupture the unhardened toner particles. The colors obtained in each individual, selectively photohardened square region of the image are listed in Table II:

TABLE II

| Filter | Distance From Lamp (inches) | Exposure Time (seconds) | Color Produced |
| --- | --- | --- | --- |
| Long-pass 435 nm | 2 | 30 | Blue |
| Band-Pass 370 nm | 2 | 5 | |
| Interference 480 nm | 2 | 60 | Magenta |
| Band-pass 355 nm | 6 | 10 | Red |
| Long-pass 530 nm | 6 | 600 | |
| Band-pass 355 nm | 6 | 10 | Yellow |
| White light (no filter) | 6 | 180 | White |

Similar multicolor images have also been obtained by producing a toned image in the Savin 895 directly on plain paper (for example, Savin 2200 copy paper) followed by selective photohardening and crushing against NCR paper to develop color. In addition, toned images have been obtained on an overhead transparency sheet designed for photocopier use (a product of 3M). If the transparency has been coated with citric acid before electrostating toning, a colored image results on the transparency.

What is claimed is:

1. A photopolymerizable composition comprising (A) at least one addition-polymerizable, ethylenically unsaturated compound having at least one terminal ethylene group and being capable of forming a high polymer by photoinitiated addition polymerization; and (B) an addition polymerization-initiating combination of (1) an organic-soluble, substantially water-insoluble, radiation-sensitive xanthene dye compound that absorbs actinic radiation and is raised to an active state and (2) a substantially water-insoluble organic activator compound that produces free radicals by interaction with said active state of said radiation-sensitive dye, wherein the dye is a salt or ester of eosin, and wherein the activator is a trichloromethyl-substituted triazine.

2. A composition as defined in claim 1, wherein the ethylenically unsaturated compound is selected from the group consisting of ethylenically unsaturated acid esters of polyhydric alcohols, acrylate prepolymers derived from the partial reaction of pentaerythritol with acrylic or methacrylic acid or their acid esters, isocyanate-modified acrylates, and methacrylate and itaconic acid esters of polyhydric alcohols.

3. A composition as defined in claim 1, wherein the ethylenically unsaturated compound is an acrylate.

4. A composition as defined in claim 3, wherein the acrylate is a diacrylate.

5. A composition as defined in claim 3, wherein the acrylate is a triacrylate.

6. A composition as defined in claim 1, wherein the dye is ethyl eosin tetraethyl ammonium salt.

7. A composition as defined in claim 1, wherein the dye is methyl eosin.

8. A composition as defined in claim 1, wherein the triazine is 2,4,6-tris(trichloromethyl)-1,3,5-triazine.

* * * * *